(12) United States Patent
Nishihara et al.

(10) Patent No.: US 7,786,649 B2
(45) Date of Patent: Aug. 31, 2010

(54) FILTER AND DUPLEXER

(75) Inventors: Tokihiro Nishihara, Kawasaki (JP); Shinji Taniguchi, Kawasaki (JP); Masafumi Iwaki, Kawasaki (JP); Tsuyoshi Yokoyama, Kawasaki (JP); Takeshi Sakashita, Kawasaki (JP); Masanori Ueda, Kawasaki (JP); Yasuyuki Saitou, Yokohama (JP)

(73) Assignees: Fujitsu Media Devices Limited, Yokohama (JP); Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 11/790,530

(22) Filed: Apr. 26, 2007

(65) Prior Publication Data

US 2007/0252662 A1    Nov. 1, 2007

(30) Foreign Application Priority Data

Apr. 27, 2006  (JP) .............................. 2006-124447

(51) Int. Cl.
*H01L 41/04* (2006.01)
(52) U.S. Cl. ...................................... 310/320; 310/324
(58) Field of Classification Search .................. 310/324
See application file for complete search history.

(56) References Cited

U.S. PATENT DOCUMENTS 4,841,264 A * 6/1989 Oshikawa ................... 333/189
7,187,255 B2 * 3/2007 Wang et al. .................. 333/189
2005/0099094 A1 * 5/2005 Nishihara et al. ........... 310/324
2005/0134400 A1 * 6/2005 Huynh ........................ 333/133
2005/0218754 A1 * 10/2005 Yokoyama et al. .......... 310/328

FOREIGN PATENT DOCUMENTS

| JP | 2003133892 A | 5/2003 |
|----|--------------|--------|
| JP | 2003-283296 A | 10/2003 |
| JP | 2005-124107 A | 5/2005 |
| JP | 2007-227998 A | 9/2007 |

\* cited by examiner

*Primary Examiner*—Walter Benson
*Assistant Examiner*—Derek J Rosenau
(74) *Attorney, Agent, or Firm*—Arent Fox LLP

(57) ABSTRACT

A filter includes piezoelectric thin-film resonators having a substrate, a lower electrode supported by the substrate, a piezoelectric film provided on the lower electrode, and an upper electrode provided on the piezoelectric film. At least one of the piezoelectric thin-film resonators has a portion in which the upper electrode overlaps the lower electrode across the piezoelectric film. The above portion has a shape different from shapes of corresponding portions of other piezoelectric thin-film resonators, so that a spurious component in the above at least one of the piezoelectric thin-film resonators occur at a frequency different from frequencies of spurious components that occur in the other piezoelectric thin-film resonators.

8 Claims, 6 Drawing Sheets

US 7,786,649 B2

FILTER AND DUPLEXER

BACKGROUND OF THE INVENTION

1. Field of the Invention

This invention generally relates to filters and duplexers, and more particularly, to a filter having upper and lower electrodes provided on opposite surfaces of a piezoelectric film in which an overlapping region of the upper and lower electrodes across the piezoelectric film has an elliptical shape and a duplexer with such a filter.

2. Description of the Related Art

Recently, there has been an increasing demand for filters with compact and light resonators and filters configured by combining these filters as wireless communication equipment that may be typically cellular phones has spread rapidly. In the past, dielectric filters or surface acoustic wave (SAW) filters were mainly used. Nowadays, piezoelectric thin film resonators and filters using these resonators are attracting attention, in which the piezoelectric thin film resonators are characterized in that they gave good high-frequency performance and are compact and producible as a monolithic device.

The piezoelectric thin-film resonators may be categorized into an FBAR (Film Bulk Acoustic Resonator) type and an SMR (Solidly Mounted Resonator) type. The FBAR has a primary structure composed of an upper electrode, a piezoelectric film and a lower electrode, and a gap provided below the lower electrode and located within an overlapping region (resonance portion) in which the upper and lower electrodes overlap with each other across the piezoelectric film. The gap may be defined between the lower electrode and a silicon substrate by wet-etching a sacrificed layer on a main surface of the silicon substrate. The gap may also be formed by wet- or dry-etching the substrate from the backside thereof. The SMR employs an acoustic reflection film instead of the gap, in which a first film having a relatively high acoustic impedance and a second film having a relative low acoustic impedance are alternately laminated with a film thickness of $\lambda/4$ where $\lambda$ is the wavelength of an acoustic wave of the resonator.

The upper and lower electrodes may be made of aluminum (Al), copper (Cu), molybdenum (Mo), tungsten (W), tantalum (Ta), platinum (Pt), ruthenium (Ru), rhodium (Rh), iridium (Ir) or the like. The piezoelectric thin film may be made of aluminum nitride (AlN), zinc oxide (ZnO), lead zirconium titanate (PZT), lead titanate (PbTiO$_3$) or the like. The substrate may be made of glass other than silicon.

In the above-mentioned piezoelectric thin film resonator, an unnecessary wave of a lateral mode is excited in addition to the thickness longitudinal vibration wave. The wave of the lateral mode is propagated in parallel with the electrode surfaces and is reflected by ends of the electrodes or gap. The wave of the lateral mode may cause an unnecessary spurious component in the impedance characteristic of the resonator and a ripple in the pass band of the filter. The problems result in some difficulties in applications.

Japanese Patent Application Publication No. 2005-124107 discloses an improved a piezoelectric thin-film resonator and a filter using the same directed to restraining influence of the lateral wave in which the overlapping portions of the lower and upper electrodes have an elliptical shape having a major-axis length a and a minor-axis length designed so as to satisfy $1.0 < a/b < 1.9$.

The elliptical shape of the overlapping portions of the upper and lower electrodes reduces the spurious components in the resonance performance of the resonator, as compared to a comparative filter having a circular shape of the overlapping portions. However, it may be desired to further improve the resonance performance and reduce the ripple in the pass band and to further improve the filter insertion loss and group delay characteristic.

SUMMARY OF THE INVENTION

The present invention has been made in view of the above circumstances and provides a filter having reduced ripples in the pass band and a duplexer equipped with such a filter.

According to an aspect of the present invention, there is provided a filter including: piezoelectric thin-film resonators having a substrate, a lower electrode supported by the substrate, a piezoelectric film provided on the lower electrode, and an upper electrode provided on the piezoelectric film, at least one of the piezoelectric thin-film resonators having a portion in which the upper electrode overlaps the lower electrode across the piezoelectric film, said portion having a shape different from shapes of corresponding portions of other piezoelectric thin-film resonators, so that a spurious component in said at least one of the piezoelectric thin-film resonators occur at a frequency different from frequencies of spurious components that occur in the other piezoelectric thin-film resonators.

According to another aspect of the present invention, there is provided a filter including: series-arm resonators and parallel-arm resonators having a substrate, a lower electrode supported by the substrate, a piezoelectric film provided on the lower electrode and an upper electrode provided on the piezoelectric film, each of multiple resonators among the series-arm resonators and parallel-arm resonators having a portion in which the upper electrode overlaps the lower electrode across the piezoelectric film, said portion having an elliptical shape, an axial ratio of said portion of one of the multiple resonators being different from axial ratios of portions of other resonators among the multiple resonators.

According to yet another aspect of the present invention, there is provided a duplexer including: a transmit filter connected to a common terminal; and a receive filter connected to the common terminal, at least one of the transmit filter and the receive filter having a filter including: piezoelectric thin-film resonators having a substrate, a lower electrode supported by the substrate, a piezoelectric film provided on the lower electrode, and an upper electrode provided on the piezoelectric film, at least one of the piezoelectric thin-film resonators having a portion in which the upper electrode overlaps the lower electrode across the piezoelectric film, said portion having a shape different from shapes of corresponding portions of other piezoelectric thin-film resonators, so that a spurious component in said at least one of the piezoelectric thin-film resonators occur at a frequency different from frequencies of spurious components that occur in the other piezoelectric thin-film resonators.

According to a further aspect of the present invention, there is provided a duplexer including: a transmit filter connected to a common terminal; and a receive filter connected to the common terminal, at least one of the transmit filter and the receive filter having a filter including: series-arm resonators and parallel-arm resonators having a substrate, a lower electrode supported by the substrate, a piezoelectric film provided on the lower electrode and an upper electrode provided on the piezoelectric film, each of multiple resonators among the series-arm resonators and parallel-arm resonators having a portion in which the upper electrode overlaps the lower electrode across the piezoelectric film, said portion having an elliptical shape, an axial ratio of said portion of one of the multiple resonators being different from axial ratios of portions of other resonators among the multiple resonators.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of the principle of the present invention with reference to experimental results.

Figure 1:
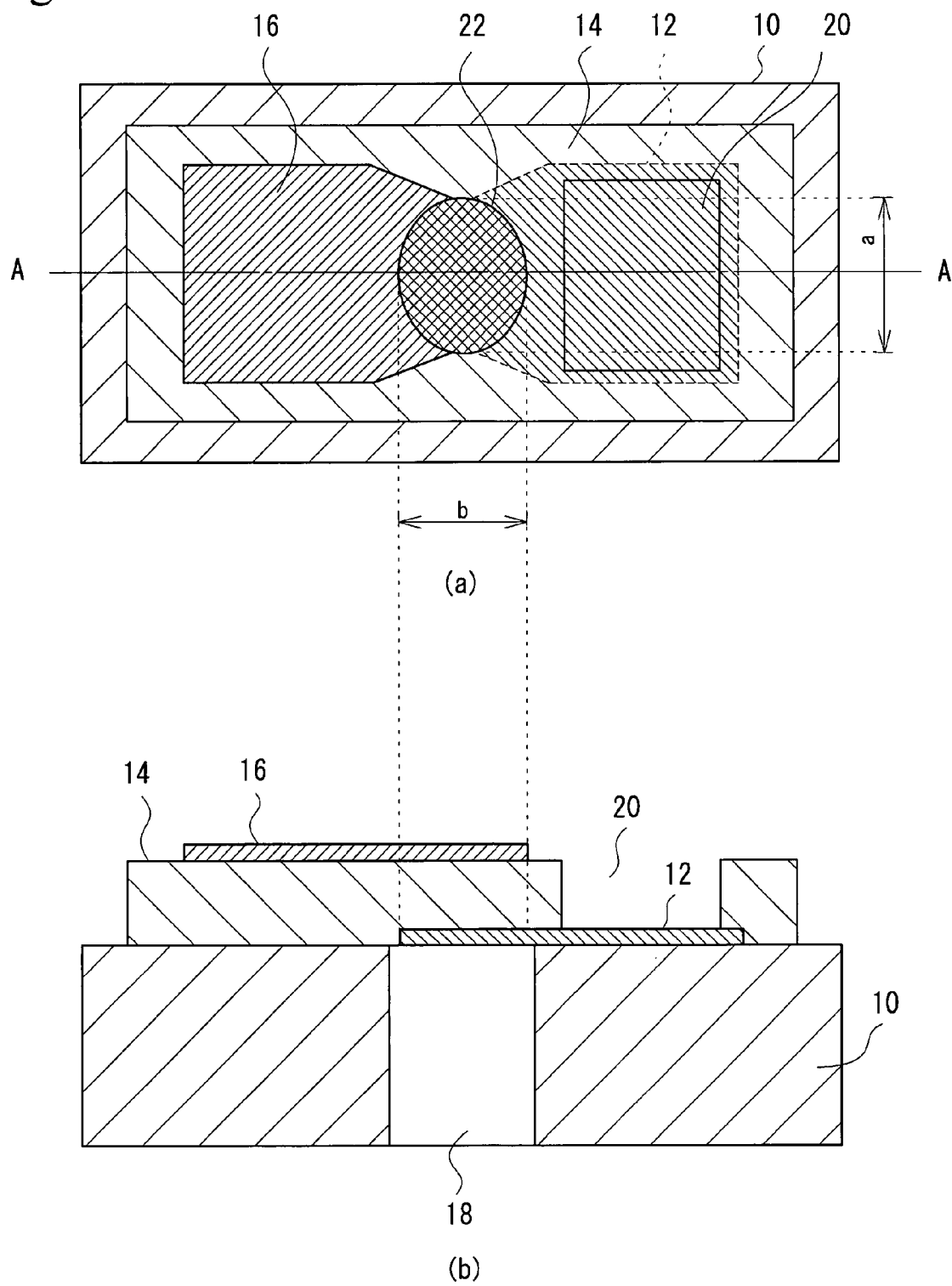
FIG. 1 shows a piezoelectric thin film resonator in which part (a) of FIG. 1 is a plan view thereof, and part (b) is a cross-sectional view taken along a line A-A shown in part (a)

FIG. 1 shows a piezoelectric thin-film resonator used in an experiment. More particularly, part (a) of FIG. 1 is a plan view of the resonator, and part (b) thereof is a cross-sectional view taken along a line A-A shown in part (a). A lower electrode 12 is formed on a silicon substrate 10, and is composed of two films of a Ru film and a Cr film. A piezoelectric film 14, which may, for example, be an AlN film, is provided on the silicon substrate 10 and the lower electrode 12. An upper electrode 16, which may, for example, be a Ru film, is provided on the piezoelectric film 14. An opening 20 is formed in the piezoelectric film 14 and is located above the lower electrode 12. The opening 20 is used to make an electrical connection with the lower electrode 12. A cavity 18 is formed in the silicon substrate 10 and is located below a portion in which the upper electrode 16 overlaps the lower electrode 12 across the piezoelectric film 14. Sputtering and etching may be used to form the lower electrode 12, the piezoelectric film 14 and the upper electrode 16. The cavity 18 may be defined by dry etching the silicon substrate 10 by deep-RIE so that the cavity 18 has a substantially vertical wall.

In the experiment, the inventors prepared three piezoelectric thin-film resonators (resonators #1 through #3) each having a resonance frequency close to 2 GHz. The inventors investigated the relationships between the ratio of the major-axis length to the minor-axis length of an elliptical portion 22 in which the upper electrode 16 overlaps the lower electrode 12 across the piezoelectric film 14 and the spurious components in the resonance characteristics. The major and minor axes a and b of the elliptical portions 22 of resonators #1 through #3 had dimensions as shown in Table 1 in which the axial ratios are also shown. The elliptical portions 22 of resonators #1 through #3 had almost the same areas.

TABLE 1

| Resonator | Axial ratio (a/b) | Major axis (a) μm | Minor axis (b) μm |
|---|---|---|---|
| Resonator #1 | 1.2 | 162.4 | 135.3 |
| Resonator #2 | 1.4 | 175.4 | 125.3 |
| Resonator #3 | 1.8 | 198.9 | 110.5 |

Figure 2A:
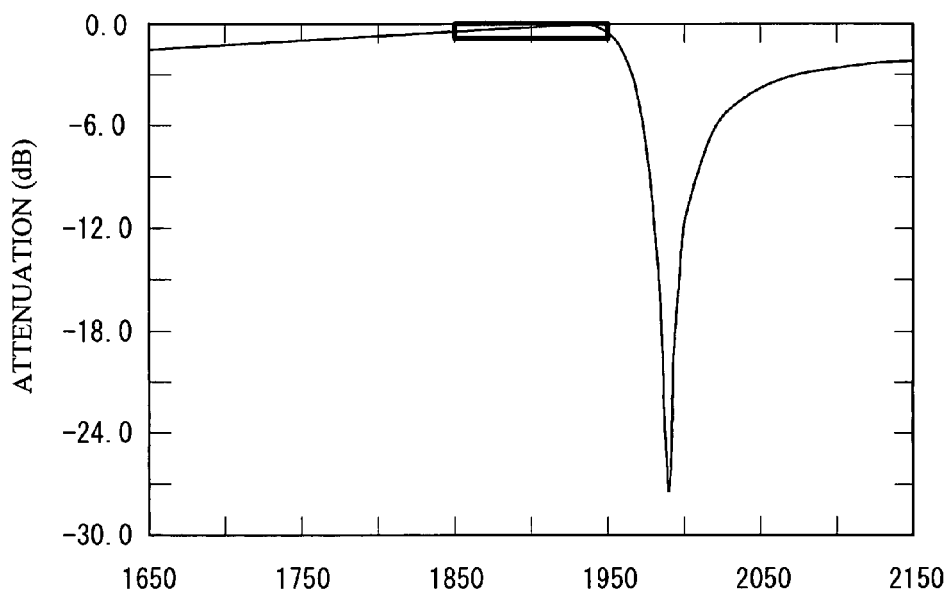
FIGS. 2A and 2B are graphs of pass band characteristics of resonators #1 through #3.
Figure 2B:
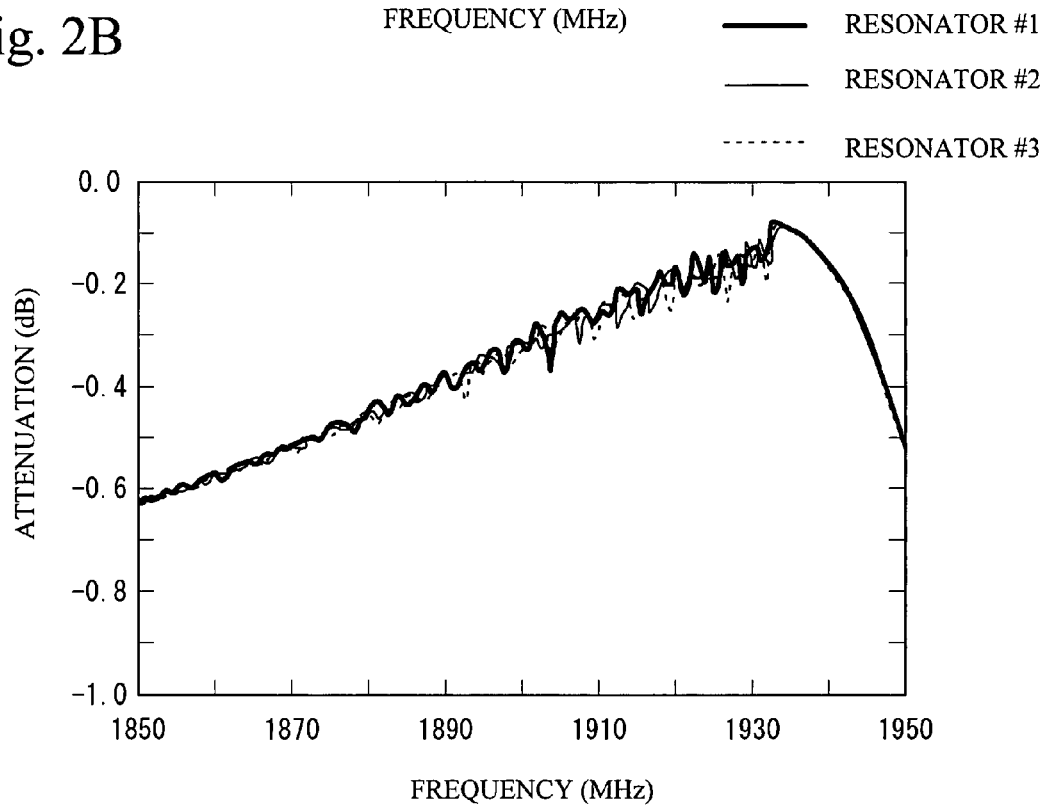

FIG. 2A shows pass band characteristics of resonators #1 through #3, and FIG. 2B is an enlarged view of a rectangular portion shown in FIG. 2A. It can be seen from FIG. 2B that the different axial ratios a/b of the elliptical portion 22 change the frequencies at which spurious components occur. In a case where multiple resonators are combined to form a filter, if those resonators have identical frequencies at which spurious components occur, ripples take place in the pass band of the filter. With the above in mind, according to a first embodiment, a filter is made up of resonators having different frequencies at which spurious components occur, so that ripples in the pass band of the filter can be reduced.

First Embodiment

Figure 3:
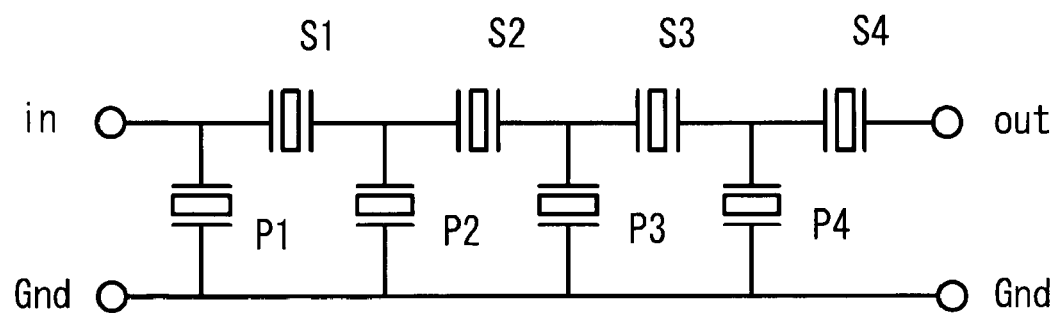
FIG. 3 is a circuit diagram of a filter in accordance with a first embodiment of the present invention.
Figure 4:
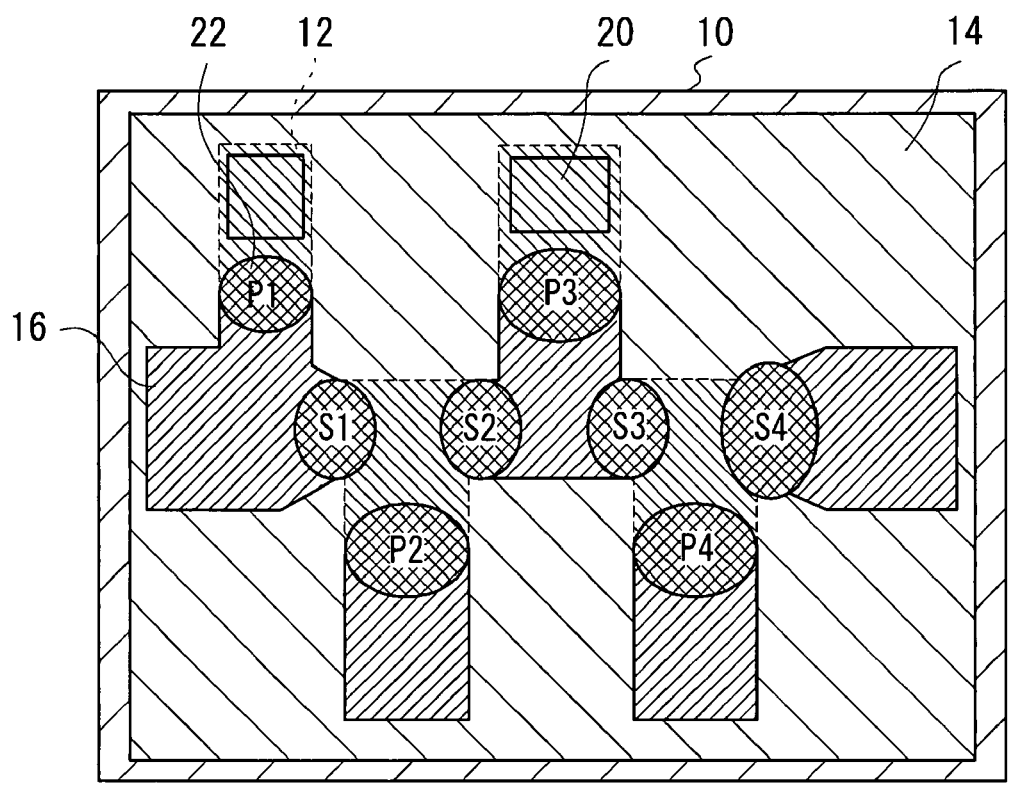
FIG. 4 is a plan view of filter #1 in accordance with the first embodiment.
Figure 5:
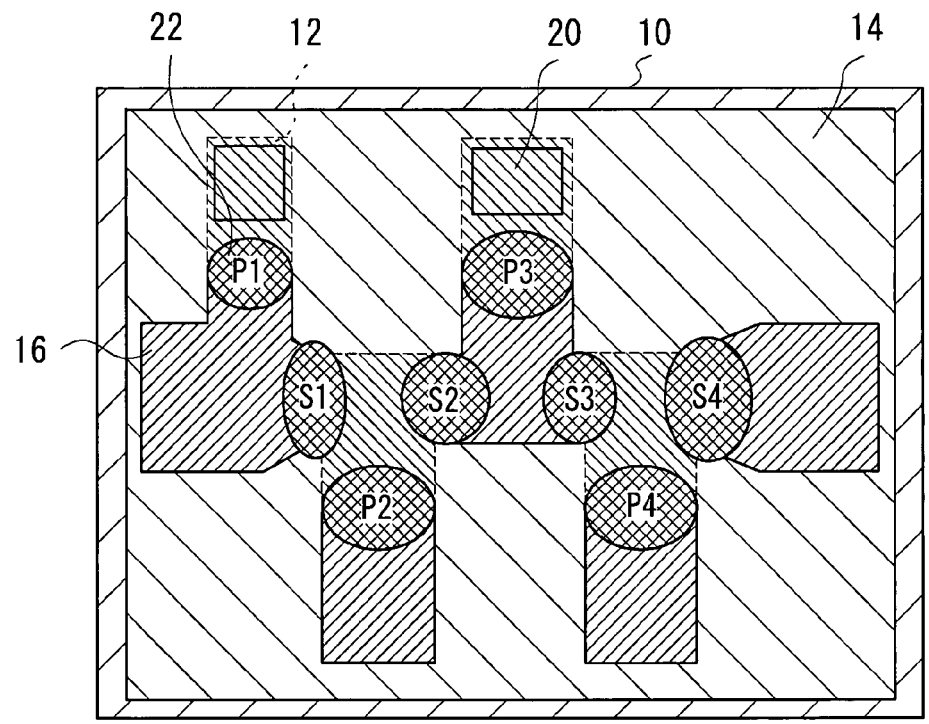
FIG. 5 is a plan view of filter #2 in accordance with the second embodiment.
Figure 6:
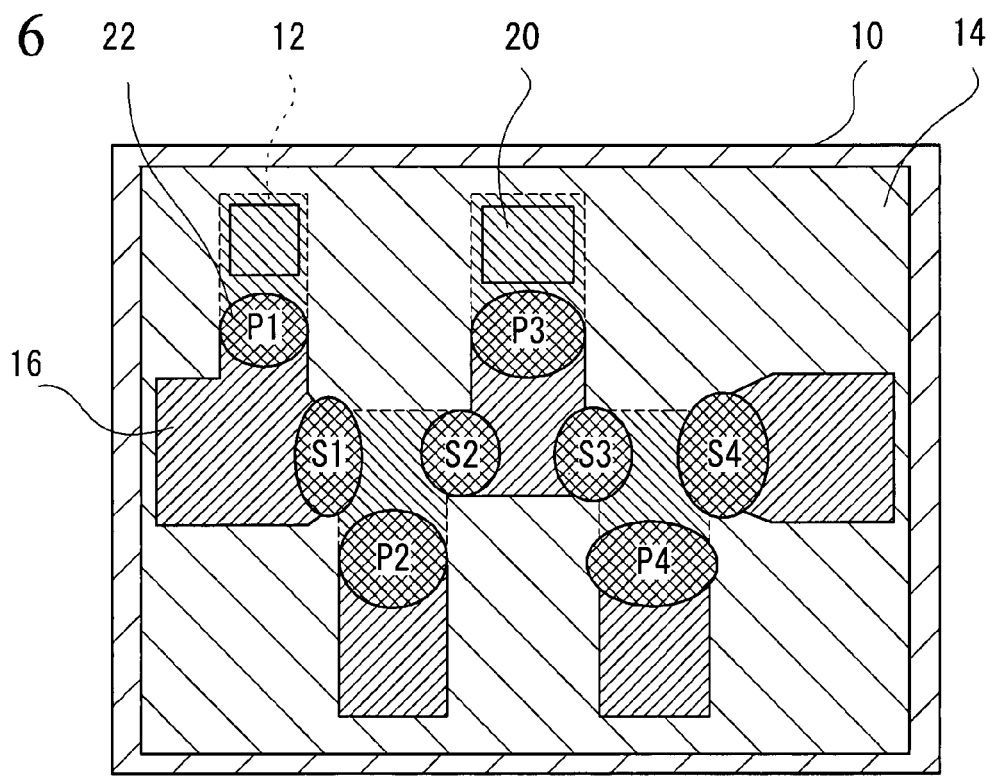
FIG. 6 is a plan view of filter #3 in accordance with the third embodiment.

The first embodiment is a ladder type filter having a center frequency of 1950 MHz and including series-arm resonators and parallel-arm resonators. We produced three samples of the above ladder type filter. These three samples are named filters #1 through #3. FIG. 3 is a circuit diagram of filters #1 through #3. The ladder type filter of the first embodiment is composed of series-arm resonators S1 through S4 and parallel-arm resonators P1 through P4. Table 2 shows dimensions and ratios of the major and minor axes a and b of the elliptical portions 22 of the resonators of the produced ladder type filters (filters #1 through #3). In each of filters #1 through #3, the elliptical portions 22 of the series-arm resonators S1 through S3 have almost the same areas, and those of the parallel-arm resonators P2 through P4 have almost the same areas. FIG. 4 is a plan view of filter #1, FIG. 5 is a plan view of filter #2, and FIG. 6 is a plan view of filter #3. In FIGS. 4 through 6, identical numeral numbers are assigned to identical parts.

TABLE 2

| Reso- | Filter #1 | | Filter #2 | | Filter #3 | |
|---|---|---|---|---|---|---|
| nator | a/b | a * b | a/b | a * b | a/b | a * b |
| S1 | 1.4 | 175.4 * 125.3 | 1.8 | 198.9 * 110.5 | 1.8 | 198.9 * 110.5 |
| S2 | 1.4 | 175.4 * 125.3 | 1.2 | 162.4 * 135.3 | 1.2 | 162.4 * 135.3 |
| S3 | 1.4 | 175.4 * 125.3 | 1.4 | 175.4 * 125.3 | 1.4 | 175.4 * 125.3 |
| S4 | 1.4 | 248.0 * 177.2 | 1.4 | 248.0 * 177.2 | 1.4 | 248.0 * 177.2 |
| P1 | 1.2 | 129.9 * 108.3 | 1.2 | 129.9 * 108.3 | 1.2 | 129.9 * 108.3 |
| P2 | 1.4 | 198.4 * 141.7 | 1.4 | 198.4 * 141.7 | 1.2 | 183.8 * 153.2 |
| P3 | 1.4 | 198.4 * 141.7 | 1.4 | 198.4 * 141.7 | 1.4 | 198.4 * 141.7 |
| P4 | 1.4 | 198.4 * 141.7 | 1.4 | 198.4 * 141.7 | 1.6 | 212.1 * 132.6 |

Referring to FIG. 4 and Table 2, in filter #1, all the series-arm resonators S1 through S4 have an identical axial ratio of 1.4 of the elliptical portions 22. The axial ratio of the parallel-arm resonator p1 is equal to 1.2, and the parallel-arm resonators P2 through P4 have an axial ratio of 1.4.

Referring to FIG. 5 and Table 2, in filter #2, the series-arm resonators S1, S2 and S3 have different axial ratios of 1.8, 1.2 and 1.4 of the elliptical portions 22, respectively. The axial ratios of the series-arm resonator S4 and the parallel-arm resonators P1 through P4 are the same as those in filter #1. As described above, filter #2 is designed so that the elliptical portions 22 of the series-arm resonators S1 through S3 among the series-arm resonators S1 through S4 have almost the same areas but have different axial ratios.

Referring to FIG. 6 and Table 2, in filter #3, the series-arm resonators S1 through S4 and the parallel-arm resonator P1 are the same as those of filter #2. The parallel-arm resonators P2, P3 and P4 have different axial ratios of 1.2, 1.4 and 1.6 of the elliptical portions 22, respectively. As described above, filter #3 is designed so that the elliptical portions 22 of the parallel-arm resonators P2 through P4 among the parallel-arm resonators P1 through P4 have almost the same areas but have different axial ratios.

Figure 7A:
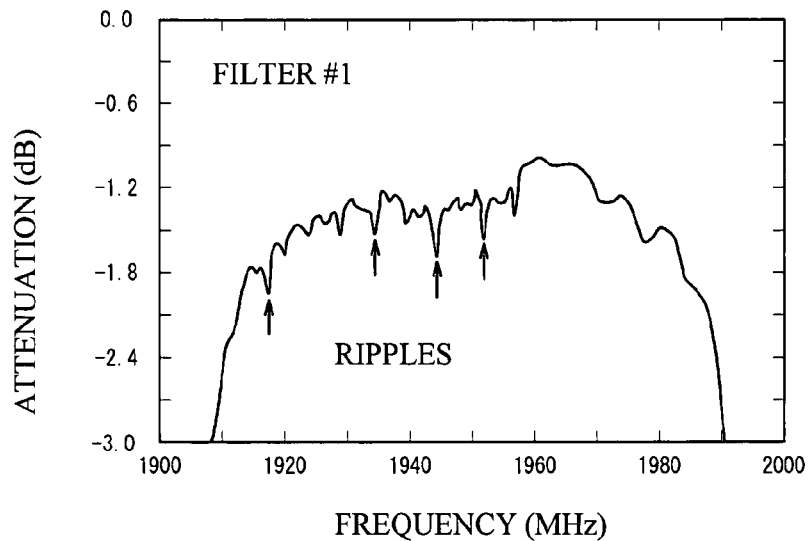
FIGS. 7A through 7C are graphs of pass band characteristics of filters #1 through #3.
Figure 7B:
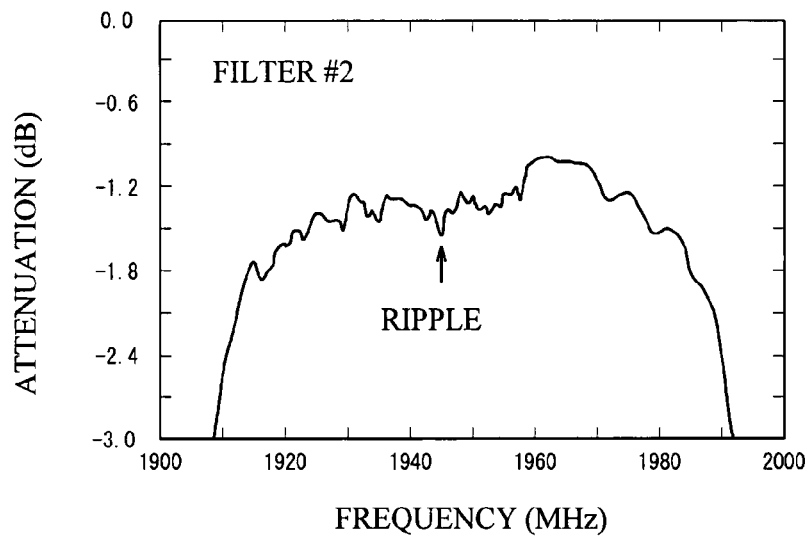
Figure 7C:
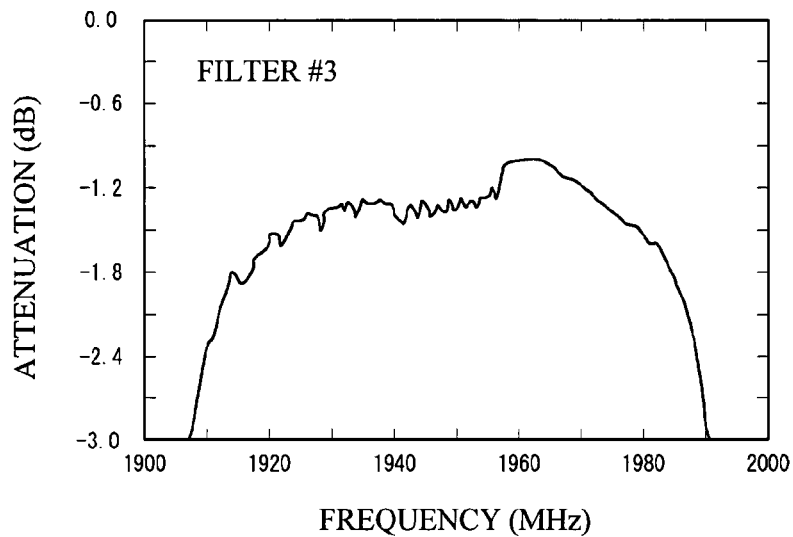

FIGS. 7A through 7C show pass band characteristics of filters #1 through #3. Filters #1 through #3 have further reduced ripples in this order. This shows that the different axial ratios of the elliptical portions 22 of the multiple resonators change frequencies at which spurious components take place and ripples in the pas band can be restricted.

The series-arm resonators and parallel-arm resonators that form the filter are not limited to those employed in the first embodiment. The present invention includes an arrangement in which the elliptical portion 22 of at least one of the series-arm and parallel-arm piezoelectric thin-film resonators has a shape different from the shapes of the elliptical portions 22 of the other resonators so that spurious components occur at different frequencies. It is thus possible to prevent spurious components of the piezoelectric thin-film resonators from overlapping and to suppress ripples in the pass band of the filter.

The present invention is not limited to an arrangement in which all of the series-arm resonators and the parallel-arm resonators have elliptical portions, but includes another arrangement in which some resonators have overlapping portions 22 having a shape other than the ellipse. That is, only some resonators among the series-arm resonators and the parallel-arm resonators have the elliptical portions 22. At least one of the resonators having the elliptical portions 22 has an axial ratio a/b different from the axial ratios of the other resonators having the elliptical portions 22. It is thus possible to prevent spurious components of the multiple resonators having the elliptical portions 22 from overlapping and to reduce the ripples in the pass band of the filter, as shown in FIGS. 7A through 7C.

Like filter #2, the resonators having different axial ratios a/b of the elliptical portions 22 may be assigned to the series-arm resonators S1 through S4. The series-arm resonators S1 through S4 are likely to have close frequencies at which spurious components occur. The different axial ratios of the elliptical portions 22 of the series-arm resonators S1 through S4 restrain ripples that occur in the pass band of the filter, as can be seen from the pass band characteristic of filter #1 (FIG. 7A) and that of filter #2 (FIG. 7B).

Further, like filter #2, the resonators having different axial ratios a/b of the elliptical portions 22 that have almost the same areas may be assigned to the series-arm resonators S2 through S4. When the elliptical-portions 22 have almost the same areas, the spurious components of the resonators are likely to occur at almost the same frequencies. Thus, the elliptical portions 22 having almost the same areas are designed to have the different axial ratios a/b in order to prevent the spurious components from overlapping and reduce the ripples in the bass band of the filter. Preferably, all the series-arm resonators with the elliptical portions 22 having different areas are designed to have mutually different axial ratios a/b of the elliptical portions 22. This setting makes it possible to cause the spurious components in the series-arm resonators with the elliptical portions 22 having almost the same areas to be generated at mutually different frequencies and to further reduce the ripples in the pass band of the filter.

Like filter #3, the resonators having different axial ratios a/b of the elliptical portions 22 that have almost the same areas may be allotted to the parallel-arm resonators P1 through P4. The parallel-arm resonators are likely to have close frequencies at which spurious components occur. The different axial ratios of the elliptical portions 22 of the parallel-arm resonators P1 through P4 reduce the ripples in the pass band of the filter, as can be seen from comparison between the pass band of filter #1 (FIG. 7B) and that of filter #3 (FIG. 7C).

Further, like filter #3, the resonators having different axial ratios a/b of the elliptical portions 22 that have almost the same areas may be allotted to the parallel-arm resonators P2 through P4. As in the case of filter #2, it is possible to prevent spurious components of the parallel-am resonators P2 through P4 having the elliptical portions 22 from overlapping and to reduce the ripples in the pass band of the filter. It is thus preferable to design all the parallel-arm resonators with the elliptical portions 22 having almost the same areas to have different axial ratios a/b. Thus, the parallel-arm resonators with the elliptical portions 22 having almost the same areas can be given the mutually different frequencies at which spurious components occur, and the ripples in the pass band of the filter can be further reduced.

Preferably, like filter #3, the elliptical portions 22 of the series-arm resonators and the parallel-arm resonators have the mutually different axial ratios a/b.

The resonators with the elliptical portions 22 having almost the same areas may be arbitrarily employed in accordance with the design specifications of the filter. The almost the same areas of the elliptical portions 22 of the resonators result in close frequencies at which spurious components overlap when the resonators are designed to have an identical axial ratio a/b. The close frequencies at which spurious components overlap are a factor that causes a ripple to occur in the pass band of the filter. For example, if the difference between the areas of the elliptical portions 22 of multiple resonators is equal to or less than ±20%, the multiple resonators will have close frequencies at which spurious components overlap. If the difference between the areas of the elliptical portions 22 of multiple resonators is equal to or less than ±10%, the multiple resonators will have closer frequencies at which spurious components overlap more greatly.

Preferably, the axial ratios a/b of the elliptical portions 22 of the resonators satisfy 1<a/b<1.9, as described in Japanese Patent Application Publication No. 2005-124107. It is thus possible to reduce spurious components of the resonators and reduce ripples in the pass band of the filter.

Second Embodiment

A second embodiment is a duplexer equipped with a transmit filter and a receive filter, which filters are configured in accordance with the above-mentioned first embodiment.

Figure 8:
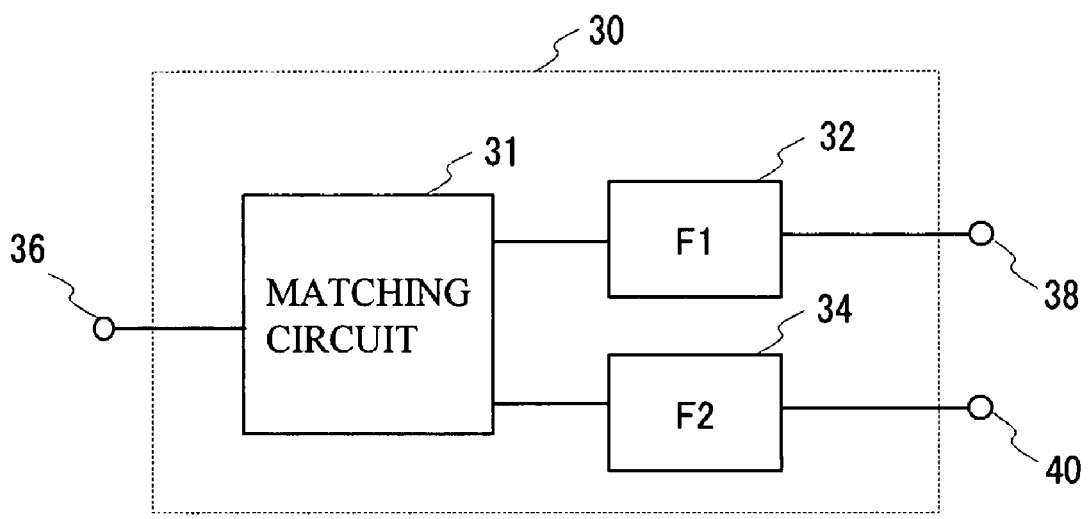
FIG. 8 is a block diagram of a duplexer in accordance with a second embodiment of the present invention.

Referring to FIG. 8, a duplexer 30 includes a transmit filter 32, a receive filter 34 and a matching circuit 31. The transmit filter 32 is provided between a common terminal 36 and a transmit terminal 38, and the receive filter 34 is provided between the common terminal 36 and a receive terminal 40. Since the transmit filter 32 and the receive filter 34 are configured in accordance with the first embodiment, the duplexer has reduced ripples in the pass bands. The first embodiment may be applied to both the transmit filter 32 and the receive filter 34 or one of these filters.

The first and second embodiments use the piezoelectric thin-film resonators as shown in parts (a) and (b) of FIG. 1. These resonators may include the aforementioned silicon substrate 10, the lower electrode 12, the piezoelectric film 14 and the upper electrode 16, which may be formed with materials that have been described previously. The cavity 18 may be defined between the silicon substrate 10 and the lower electrode 12. That is, the lower electrode 12 has a curved portion in the elliptical portion 22 so as to be spaced apart from the silicon substrate 10. The resonators are not limited to FBAR but may be SMR. The structure shown in parts (a) and (b) of FIG. 1 is only a main portion of the resonator and another member may be applied thereto. For example, a dielectric film serving as a reinforcement member or an etching stop layer for the cavity 18 may underlie the lower electrode 12 for frequency adjustment. A passivation film or a dielectric film for frequency adjustment may be provided on the upper electrode 16. The elliptical shape of the elliptical portion 22 is not limited to geometrically elliptical shapes but may include another shape, which may be obtained by deforming a circle symmetrical in the major and minor axes.

The present invention is not limited to the specifically described embodiments, but include other embodiments and variations without departing from the scope of the present invention.

The present invention is based on Japanese Patent Application No. 2006-124447 filed Apr. 27, 2006, the entire disclosure of which is hereby incorporated by reference.

What is claimed is:

1. A filter comprising:
   series-arm resonators and parallel-arm resonators having a substrate, a lower electrode supported by the substrate, a piezoelectric film provided on the lower electrode and an upper electrode provided on the piezoelectric film, the filter being a ladder type filter,
   each of multiple resonators among the series-arm resonators and parallel-arm resonators having a portion in which the upper electrode overlaps the lower electrode across the piezoelectric film, said portion having an elliptical shape,
   an axial ratio of said portion of one of the series-arm resonators being different from axial ratios of portions of at least one of the other resonators among the series-arm resonators, an area of the portion of said one of the series-arm resonators being the same as that of the portion of said at least one of the other resonators among the series-arm resonators.

2. The filter as claimed in claim 1, wherein the portion of each of the multiple resonators has the elliptical shape having a major axis a and a minor axis b satisfying 1<a/b<1.9.

3. The filter as claimed in claim 1, wherein the portions of the multiple resonators are provided above cavities formed in the substrate.

4. A filter comprising:
   series-arm resonators and parallel-arm resonators having a substrate, a lower electrode supported by the substrate, a piezoelectric film provided on the lower electrode and an upper electrode provided on the piezoelectric film, the filter being a ladder time filter,
   each of multiple resonators among the series-arm resonators and parallel-arm resonators having a portion in which the upper electrode overlaps the lower electrode across the piezoelectric film, said portion having an elliptical shape,
   an axial ratio of said portion of one of the parallel-arm resonators being different from axial ratios of portions of at least one of the other resonators among the parallel-arm resonators, an area of the portion of said one of the parallel-arm resonators being the same as that of the portion of said at least one of the other resonators among the parallel-arm resonators.

5. The filter as claimed in claim 4, wherein the portion of each of the multiple resonators has the elliptical shape having a major axis a and a minor axis b satisfying 1<a/b<1.9.

6. The filter as claimed in claim 4, wherein the portions of the multiple resonators are provided above cavities formed in the substrate.

7. A duplexer comprising:
   a transmit filter connected to a common terminal; and
   a receive filter connected to the common terminal,
   at least one of the transmit filter and the receive filter having a ladder type filter including:
   series-arm resonators and parallel-arm resonators having a substrate, a lower electrode supported by the substrate, a piezoelectric film provided on the lower electrode and an upper electrode provided on the piezoelectric film,
   each of multiple resonators among the series-arm resonators and parallel-arm resonators having a portion in which the upper electrode overlaps the lower electrode across the piezoelectric film, said portion having an elliptical shape,
   an axial ratio of said portion of one of the series-arm resonators being different from axial ratios of portions of at least one of the other resonators among the series-arm resonators, an area of the portion of said one of the series-arm resonators being the same as that of the portion of said at least one of the other resonators among the series-arm resonators.

8. A duplexer comprising:
   a transmit filter connected to a common terminal; and
   a receive filter connected to the common terminal,
   at least one of the transmit filter and the receive filter having a ladder type filter including:
   series-arm resonators and parallel-arm resonators having a substrate, a lower electrode supported by the substrate, a piezoelectric film provided on the lower electrode and an upper electrode provided on the piezoelectric film,
   each of multiple resonators among the series-arm resonators and parallel-arm resonators having a portion in which the upper electrode overlaps the lower electrode across the piezoelectric film, said portion having an elliptical shape,
   an axial ratio of said portion of one of the parallel-arm resonators being different from axial ratios of portions of at least one of the other resonators among the parallel-arm resonators, an area of the portion of said one of the parallel-arm resonators being the same as that of the portion of said at least one of the other resonators among the parallel-arm resonators.

* * * * *